(12) United States Patent
Wu et al.

(10) Patent No.: US 12,733,413 B2
(45) Date of Patent: Sep. 8, 2026

(54) METHOD FOR MANUFACTURING A NANOWIRE USING AN INDUCING PARTICLE IN A GUIDE TRENCH, METHOD FOR MANUFACTURING A THIN FILM TRANSISTOR, THIN FILM TRANSISTOR, AND SEMICONDUCTOR DEVICE

(71) Applicant: BOE TECHNOLOGY GROUP CO., LTD., Beijing (CN)

(72) Inventors: Hao Wu, Beijing (CN); Liuqing Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 399 days.

(21) Appl. No.: 18/274,392

(22) PCT Filed: May 20, 2022

(86) PCT No.: PCT/CN2022/094188

§ 371 (c)(1),
(2) Date: Jul. 26, 2023

(87) PCT Pub. No.: WO2023/221110

PCT Pub. Date: Nov. 23, 2023

(65) Prior Publication Data

US 2025/0014898 A1 Jan. 9, 2025

(51) Int. Cl.
*H10P 14/20* (2026.01)
*H10D 30/01* (2025.01)
(Continued)

(52) U.S. Cl.
CPC ......... *H10P 14/271* (2026.01); *H10D 30/014* (2025.01); *H10D 30/43* (2025.01);
(Continued)

(58) Field of Classification Search
CPC .. H10P 14/3462; H10P 14/271; H10P 14/272; H10P 14/274; H10D 62/119;
(Continued)

(56) References Cited

U.S. PATENT DOCUMENTS

2009/0230400 A1 9/2009 Chang et al.
2020/0150502 A1* 5/2020 Xu ...................... H10D 86/021

FOREIGN PATENT DOCUMENTS

CN 105047819 A 11/2015
CN 111785635 A 10/2020
(Continued)

OTHER PUBLICATIONS

CN_113394299_Machine_Translation (Year: 2021).*
(Continued)

*Primary Examiner* — Younes Boulghassoul
(74) *Attorney, Agent, or Firm* — HOUTTEMAN LAW LLC

(57) ABSTRACT

The present disclosure provides a method for manufacturing a nanowire, a method for manufacturing a thin film transistor, a thin film transistor and a semiconductor device. The method for manufacturing the nanowire includes: preparing an insulating layer on a first surface of a substrate; preparing a sacrificial layer on a surface of the insulating layer away from the substrate, and patterning the sacrificial layer to form a guide trench; preparing an inducing particle in the guide trench; preparing a precipitation layer on a surface of the sacrificial layer away from the substrate and in the guide trench, the precipitation layer covering the inducing particle; processing the precipitation layer to precipitate a preset element in the precipitation layer along the guide trench under an induction of the inducing particle to form a nanowire; and removing the sacrificial layer.

18 Claims, 8 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 86/01*** | (2026.01) |

(52) U.S. Cl.
CPC ..... *H10D 30/6744* (2025.01); *H10D 30/6757* (2025.01); *H10D 62/121* (2025.01); *H10D 86/0225* (2025.01); *H10D 86/0229* (2025.01); *H10P 14/3462* (2026.01)

(58) Field of Classification Search
CPC ............ H10D 62/121; H10D 30/6757; H10D 30/6743–6744; H10D 30/0321–0323; H10D 30/43; H10D 30/014; H10D 86/0223–0229; H01L 21/02603; H01L 21/02639; H01L 21/02642; H01L 21/02645
See application file for complete search history.

(56) References Cited

FOREIGN PATENT DOCUMENTS

| | | | | | |
|---|---|---|---|---|---|
| CN | 112018032 A | | 12/2020 | | |
| CN | 113206015 A | * | 8/2021 | ......... | H10D 30/6757 |
| CN | 113314615 A | | 8/2021 | | |
| CN | 113394299 A | * | 9/2021 | ......... | H10D 30/6757 |
| CN | 113394299 B | * | 8/2024 | ......... | H10D 30/6757 |
| CN | 113823696 B | * | 8/2024 | ........... | H10D 62/121 |
| CN | 114582974 B | * | 11/2025 | ........... | H10D 30/021 |

OTHER PUBLICATIONS

Machine Translation of CN 114582974 (Year: 2022).*
Machine Translation of CN 113823696 (Year: 2021).*
Machine Translation CN 113394299 (Year: 2021).*
Machine Translation CN 113206015 (Year: 2021).*

* cited by examiner

S

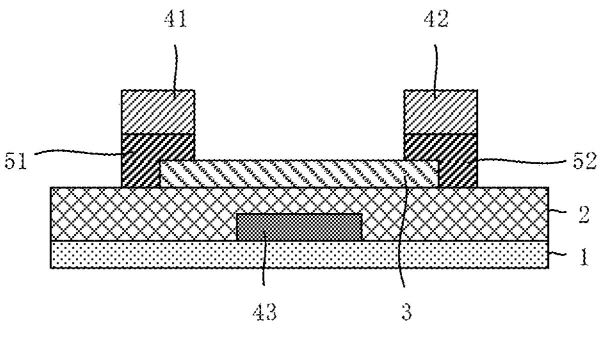
Fig. 22
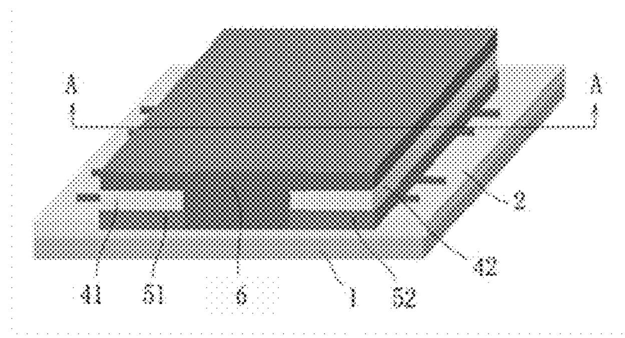
Fig. 23
41 6 42
51 52
2
1
43 3
Fig. 24

METHOD FOR MANUFACTURING A NANOWIRE USING AN INDUCING PARTICLE IN A GUIDE TRENCH, METHOD FOR MANUFACTURING A THIN FILM TRANSISTOR, THIN FILM TRANSISTOR, AND SEMICONDUCTOR DEVICE

TECHNICAL FIELD

The present disclosure relates to the field of semiconductor technology, and particularly relates to a method for manufacturing a nanowire, a method for manufacturing a thin film transistor, a thin film transistor and a semiconductor device.

BACKGROUND

A silicon nanowire is of an one-dimensional nanostructure and has characteristics such as remarkable quantum effect and ultra-large specific surface area, so that a field effect transistor (MOS) device based on the silicon nanowire has good gate control capability and current characteristics. The planar solid-liquid-solid (IP-SLS) growth technology is a technology for growing nanowires through metal catalysis, the silicon nanowires formed by this technology have a monocrystal-like characteristic, and this technology is performed under a growth temperature lower than 400° C., and has relatively high compatibility with a production line of display panels, thus can be used as a potential application technology for upgrading the production line in the future.

SUMMARY

The present disclosure is directed to provide a method for manufacturing a nanowire, a method for manufacturing a thin film transistor, a thin film transistor and a semiconductor device.

In a first aspect, the present disclosure provides a method for manufacturing a nanowire, including:

- preparing an insulating layer on a first surface of a substrate;
- preparing a sacrificial layer on a surface of the insulating layer away from the substrate, and patterning the sacrificial layer to form a guide trench;
- preparing an inducing particle in the guide trench;
- preparing a precipitation layer on a surface of the sacrificial layer away from the substrate and in the guide trench, the precipitation layer covering the inducing particle;
- processing the precipitation layer to precipitate a preset element in the precipitation layer along the guide trench under induction of the inducing particle to form a nanowire; and removing the sacrificial layer.

In some implementations, the inducing particle includes an indium particle;

- the preparing an inducing particle in the guide trench includes:
  - depositing a catalytic layer on the surface of the sacrificial layer away from the substrate and in the guide trench, and patterning the catalytic layer; and
  - reducing the patterned catalytic layer by using a plasma enhanced chemical vapor deposition process to form the inducing particle.

In some implementations, the catalytic layer is made of a material of indium tin oxide, and the precipitation layer is made of a material of amorphous silicon;

- the processing the precipitation layer to precipitate a preset element in the precipitation layer along the guide trench under induction of the inducing particle to form a nanowire includes:
  - annealing the precipitation layer to precipitate silicon in the precipitation layer along the guide trench under the induction of the inducing particle to form a silicon nanowire.

In some implementations, a material of the sacrificial layer includes one of a positive photoresist or a negative photoresist.

In some implementations, the method further includes:

- before preparing the inducing particle in the guide trench, processing the sacrificial layer through an ion implantation so as to form a porous structure in a surface layer of the sacrificial layer away from the substrate.

In some implementations, the porous structure has a thickness ranging from one thousandth to one hundredth of a total thickness of the sacrificial layer.

In some implementations, ions implanted into the sacrificial layer include at least one of phosphorous ions or boron ions;

- an acceleration voltage for the ion implantation ranges from 10 keV to 70 keV, and a dose for the ion implantation ranges from $1\times10^{13}$ ions/cm$^2$ to $5\times10^{14}$ ions/cm$^2$.

In some implementations, the method includes:

- before removing the sacrificial layer, modifying the sacrificial layer by an ashing process using oxygen plasma.

In some implementations, the removing the sacrificial layer includes: removing the modified sacrificial layer through a peeling-off process.

In some implementations, the method further includes:

- before removing the sacrificial layer, removing impurities in the inducing particle by using an etching solution; and
- removing the precipitation layer by using an etching process.

In a second aspect, the present disclosure provides a method for manufacturing a thin film transistor, where the thin film transistor includes an active layer, and the active layer includes a nanowire manufactured by the method for manufacturing the nanowire provided by the present disclosure.

In some implementations, the method further includes:

- after removing the sacrificial layer, sequentially preparing a transition layer and an electrode layer on surfaces of the insulating layer and the nanowire away from the substrate, a material of the transition layer including $N^+$ type amorphous silicon; and
- patterning the transition layer and the electrode layer so as to obtain a first electrode and a second electrode of the transistor in the electrode layer, and obtain a first transition electrode and a second transition electrode in the transition layer.

In some implementations, the transition layer and the electrode layer are patterned by using a single mask to obtain the first transition electrode and the second transition electrode in the transition layer, and obtain the first electrode and the second electrode in the electrode layer, the first transition electrode and the first electrode are stacked, and the second transition electrode and the second electrode are stacked.

In some implementations, the method further includes:

- after patterning the transition layer and the electrode layer, depositing a passivation layer covering exposed surfaces of the insulating layer, the nanowire, the first electrode and the second electrode.

In some implementations, the method further includes:

after depositing the passivation layer, patterning the passivation layer to expose at least a portion of a surface of each of the first electrode and the second electrode away from the substrate; and preparing a third electrode of the transistor on a surface of the passivation layer away from the substrate.

In some implementations, the method further includes:

before preparing the insulating layer on the first surface of the substrate, preparing a third electrode of the transistor on the first surface of the substrate.

In some implementations, the substrate includes one of a glass substrate or a silicon substrate.

In a fourth aspect, the present disclosure provides a thin film transistor, including:

a substrate including a first surface;

an insulating layer arranged on the first surface of the substrate;

a nanowire arranged on a surface of the insulating layer away from the substrate;

an electrode layer superposed on the surface of the insulating layer away from the substrate, where a first electrode arranged in the electrode layer is electrically connected with a source region of the nanowire, and a second electrode arranged in the electrode layer is electrically connected with a drain region of the nanowire.

In some implementations, at least one of phosphorus ions or boron ions are arranged in the insulating layer below the nanowire.

In some implementations, a maximum depth that the ions are doped in the insulating layer ranges from 1000 angstroms to 3000 angstroms.

In some implementations, a first transition electrode is disposed between the first electrode and the source region of the nanowire, and a second transition electrode is disposed between the second electrode and the drain region of the nanowire.

In some implementations, the first transition electrode and the second transition electrode are made of a material of $N^+$ type amorphous silicon.

In some implementations, the thin film transistor further includes a third electrode disposed between the substrate and the insulating layer.

In some implementations, the thin film transistor further includes a passivation layer covering exposed surfaces of the insulating layer, the electrode layer, and the nanowire.

In some implementations, the thin film transistor further includes a passivation layer and a third electrode, the passivation layer covering exposed surfaces of the insulating layer and the nanowire; and the third electrode is arranged on a surface of the passivation layer away from the substrate.

In a fourth aspect, the present disclosure provides a semiconductor device, including the thin film transistor provided in the present disclosure.

BRIEF DESCRIPTION OF DRAWINGS

FIG. 22 is a schematic cross-sectional diagram of the thin film transistor subjected to the step S708 in the embodiment of the present disclosure;

FIG. 23 is a schematic perspective diagram of a structure of a thin film transistor subjected to a step S709 in the embodiment of the present disclosure;

FIG. 24 is a schematic cross-sectional diagram of the thin film transistor subjected to the step S709 in the embodiment of the present disclosure.

DETAIL DESCRIPTION OF EMBODIMENTS

In order that those skilled in the art will better understand the technical solutions of the present disclosure, the following detailed description is given with reference to the accompanying drawings and the specific embodiments.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprising/including" or "comprises/includes", and the like, means that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when an absolute position of an object being described is changed, the relative positional relationships may be changed accordingly.

Figure 1:
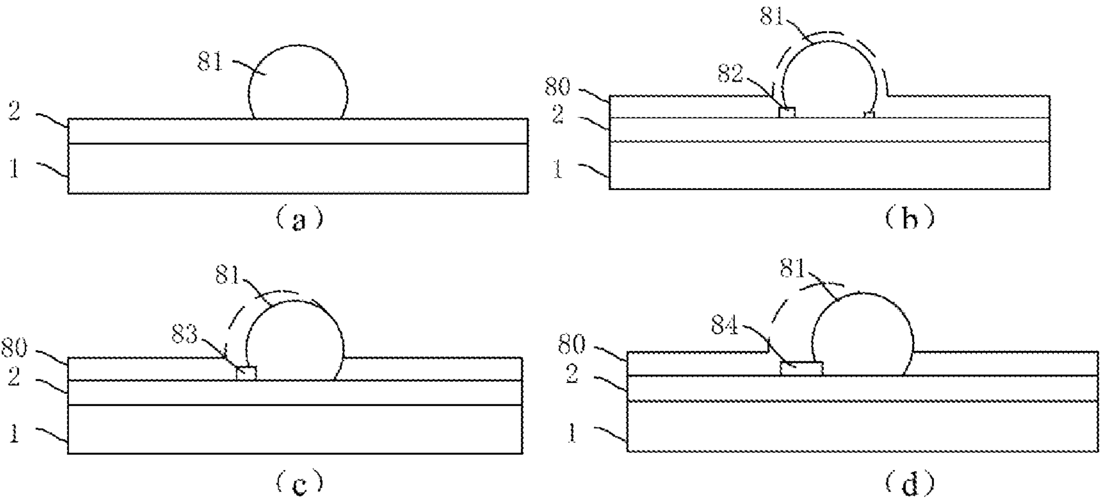
FIG. 1 is a diagram illustrating a principle of growing a nanowire.

FIG. 1 is a diagram illustrating a principle of growing a nanowire. As shown in FIG. 1, the principle of growing a nanowire includes the following steps S11 to S14.

At step S11, preparing an insulating layer 2 on a surface of a substrate 1, then preparing a catalyst layer 80 on a surface of the insulating layer 2, and performing in-situ treatment on a metal particle to form a nanoparticle 81, as shown in (a) of FIG. 1.

At step S12, depositing a precursor a-Si on the surface of the substrate 1 subjected to the step S11, and then heating the substrate 1 to form an alloy droplet, such as an indium alloy droplet 82, as shown in (b) of FIG. 1.

At step S13, precipitating a crystal nuclei 83 in response to that a concentration of silicon in the alloy droplet is over saturated, as shown in (c) of FIG. 1.

At step S14, pulling, by the alloy droplet, the crystal nucleus to grow under driving of gibbs free energy, so as to form a nanowire 84.

During the process of growing the nanowire, the nanowire grows transversely along a side wall at a bottom of a guide trench under the driving of gibbs free energy, and the nanowire grows disorderly at top of the trench due to not being guided, and thus the nanowire disorderly grown is uneven. Due to the limitation of process, the nanowire disorderly grown cannot be removed, and overlapping of a source-drain (S/D) electrode layer and the nanowire is influenced.

An embodiment of the present disclosure provides a method for manufacturing a nanowire, which can remove the nanowire disorderly grown outside a nanowire region and improve the yield of the nanowire; and the guide trench used in the process of preparing the nanowire is removed, the performance of overlapping of the electrode and the nanowire is improved, and the mobility of the nanowire is improved.

Figure 2:
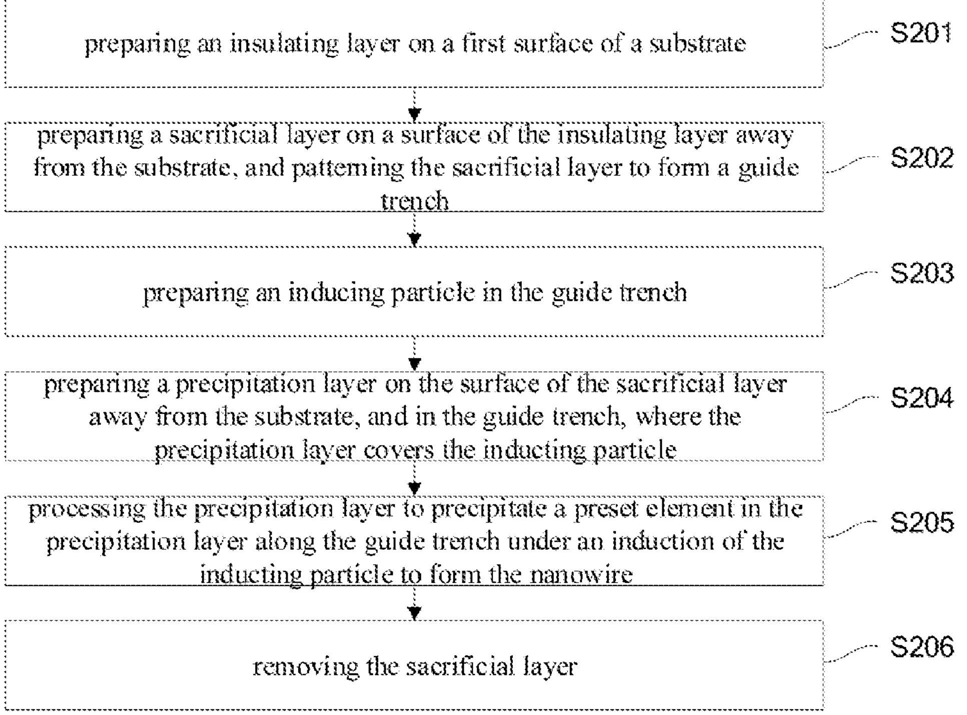
FIG. 2 is a flowchart of a method for manufacturing a nanowire according to an embodiment of the present disclosure.

FIG. 2 is a flowchart of a method for manufacturing a nanowire according to an embodiment of the present disclosure. As shown in FIG. 2, the method includes steps S201 to S206.

At step S201, preparing an insulating layer on a first surface of a substrate.

The substrate may be configured to carry electronic devices such as transistors. The substrate includes, but is not limited to, a glass substrate and a silicon substrate, and a material of the substrate is not limited by the present disclosure.

In the embodiment, the substrate includes a first surface and a second surface which are oppositely arranged, and the first surface is configured to carry various components of the electronic devices. In some implementations, the second surface may also be configured to carry electronic devices. For convenience of description, the embodiment of the present disclosure is described by taking the first surface carrying the electronic devices as an example.

The insulating layer may be made of a material comprising silicon such as silicon nitride and silicon oxide, or an organic material such as polyimide and acrylic. A thickness of the insulating layer is not limited in the embodiment of the present disclosure, for example, the thickness of the insulating layer may be about 4000 angstroms.

At step S202, preparing a sacrificial layer on a surface of the insulating layer away from the substrate, and patterning the sacrificial layer to form a guide trench.

The sacrificial layer may be formed by a coating process or other suitable processes. In some implementations, a material of the sacrificial layer includes one of a positive photoresist or a negative photoresist. The photoresist has low cost and can be prepared in a simple process, thus can reduce the manufacturing cost of the sacrificial layer.

For example, the positive photoresist serving as the sacrificial layer is prepared on the surface of the insulating layer away from the substrate by a coating process, and then the sacrificial layer is patterned by processes of exposure, development and etching to form the guide trench.

It should be noted that, during etching the sacrificial layer, only the sacrificial layer is etched, the insulating layer is not to be etched, so that a bottom of the guide trench is made of the insulating layer without the sacrificial layer. Portions, except the guide trench, of the surface of the insulating layer away from the substrate are covered by the sacrificial layer.

A thickness of the sacrificial layer is not limited in the embodiment of the present disclosure, and for example, the thickness of the sacrificial layer may be about 1.5 micrometers.

At step S203, preparing an inducing particle in the guide trench.

In some implementations, the inducing particle includes an indium particle or another suitable elemental particle. The inducing particle is helpful to the precipitation of the material for the nanowire so as to improve the generation efficiency of the nanowire.

It should be noted that, the nanowire in the embodiment of the present disclosure refers to a nanowire in an active layer, and for convenience, in the embodiment of the present disclosure, the nanowire in the active layer is referred to as the nanowire.

In some implementations, the step S203 of preparing the inducing particle in the guide trench includes steps S31 to S32.

At step S31, depositing a catalytic layer on a surface of the sacrificial layer away from the substrate and in the guide trench, and patterning the catalytic layer.

After the catalytic layer is patterned, a strip-shaped catalytic layer is obtained, and a length of the strip-shaped catalytic layer spans a width of the guide trench so as to form the inducing particle in the guide trench.

In some implementations, the catalytic layer is deposited by a physical vapor deposition process, a material of the catalytic layer includes indium tin oxide, and a thickness of the catalytic layer is not limited in the embodiment of the present disclosure, for example, the thickness of the catalytic layer may range from 100 angstroms to 500 angstroms.

The catalyst layer may be patterned through processes of coating, exposure, development and etching to obtain the strip-shaped catalyst layer. The width and length of the stripe-shaped catalytic layer are not limited in the embodiment of the present disclosure.

At step S32, performing a reduction process on the patterned catalyst layer by using a plasma enhanced chemical vapor deposition process to obtain the inducing particle.

In the embodiment of the present disclosure, an indium-inducing particle is obtained by reducing indium tin oxide by the plasma enhanced chemical vapor deposition process using hydrogen plasma (H plasma).

At step S204, preparing a precipitation layer on the surface of the sacrificial layer away from the substrate and in the guide trench, the precipitation layer covering the inducing particle.

The precipitation layer is used for forming the nanowire, and a material of the precipitation layer includes a material of the nanowire. For example, the material of the precipitation layer includes amorphous silicon (a-Si). A thickness of the precipitation layer is not limited in the embodiment of the present disclosure, and for example, the thickness of the precipitation layer is about 300 angstroms.

At step S205, processing the precipitation layer to precipitate a preset element in the precipitation layer along the guide trench under an induction of the inducing particle to form the nanowire.

In some implementations, the nanowire is generated by precipitating a silicon element of the amorphous silicon layer along the guide trench under the induction of the inducing particle through annealing.

In some implementations, the step S205 of processing the precipitation layer to precipitate the preset element in the precipitation layer along the guide trench under the induction of the inducing particle to form the nanowire includes:

annealing the precipitation layer to precipitate silicon in the precipitation layer along the guide trench under the induction of the inducing particle to obtain a silicon nanowire.

In some implementations, the annealing may be performed under a temperature in a range from 350° C. to 400° C. and the annealing may be performed for a time duration in a range from 30 min to 60 min.

At step S206, removing the sacrificial layer.

In some implementations, the sacrificial layer is removed by a peeling-off process.

In the embodiment of the present disclosure, after the sacrificial layer is removed, the nanowire disorderly grown and attached to the surface of the sacrificial layer is also removed, that is, the nanowire disorderly grown on the surface of the sacrificial layer is removed together with the guide trench, and only the nanowire is remained on the surface of the insulating layer, so that the yield of the nanowire is improved, the influence of a step difference of the guide trench can be eliminated, the overlapping of the nanowire and the electrode is improved, a contact barrier of metal-semiconductor contact is reduced, the tunneling effect at an interface is enhanced, and the mobility of the silicon nanowire is improved.

In some implementations, the step S203 further includes: before preparing the inducing particle in the guide trench, processing the sacrificial layer by an ion implantation to form a porous structure in a surface layer of the sacrificial layer away from the substrate, that is, carbonizing the sacrificial layer.

The surface of the sacrificial layer away from the substrate is processed by the ion implantation, the porous structure is formed in the surface layer of the sacrificial layer away from the substrate, the porous structure is similar to a molecular structure of diamond or graphite, thus has high stability, and pollution to a chamber caused by the sacrificial layer in subsequent processes can be avoided; moreover, a chemical solvent may be diffused to interior of the sacrificial layer through the surface layer of the porous structure to dissolve the interior of the sacrificial layer, so that the surface layer of the sacrificial layer falls off, facilitating removal of the sacrificial layer.

In some implementations, the porous structure is formed in the surface layer of the sacrificial layer away from the substrate by means of the ion implantation, and ions to be implanted include at least one of phosphorus ions ($P^+$) or boron ions ($B^+$). In some implementations, a thickness of the porous structure accounts for one thousandth to one hundredth of a total thickness of the sacrificial layer.

In some implementations, an acceleration voltage for the ion implantation ranges from 10 keV to 70 keV and an implantation dose for the ion implantation ranges from $1\times10^{13}$ ions/cm$^2$ to $5\times10^{14}$ ions/cm$^2$. Phosphorus ions and/or boron ions are implanted into the sacrificial layer under the acceleration voltage ranging from 10 keV to 70 keV, so that the phosphorus ions and/or the boron ions are positioned at a certain depth of the surface layer of the sacrificial layer, thus the sacrificial layer can be modified, the influence of the sacrificial layer on the subsequent processes is reduced, and subsequent removal of the sacrificial layer is also facilitated and the residue of the material of the sacrificial layer is reduced.

Figure 3:
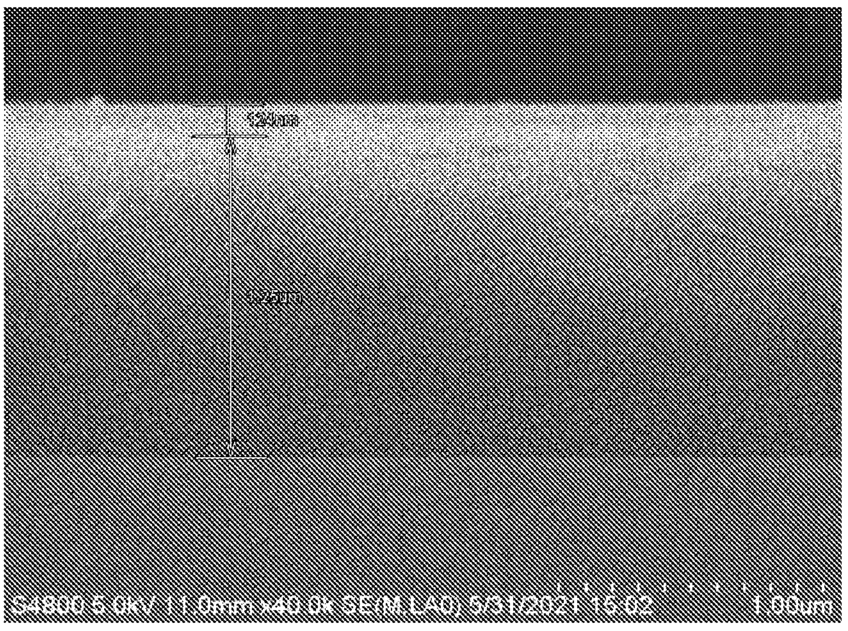
FIG. 3 is a cross-sectional view of a sacrificial layer implanted with phosphorous ions by an acceleration voltage of 20 keV and a dose of $3\times10^{14}$ ions/$cm^2$ according to an embodiment of the present disclosure.

FIG. 3 is a cross-sectional view of a sacrificial layer implanted with phosphorous ions with a dose of $3\times10^{14}$ ions/cm$^2$ under an acceleration voltage of 20 keV according to an embodiment of the present disclosure. As can be seen from the FIG. 3, the structure of the sacrificial layer subjected to the carbonizing (i.e., carbonization treatment) is changed, and color changes from the surface to the interior of the sacrificial layer in an order of light yellow, yellow and dark brown. In FIG. 3, a carbonized layer has a thickness of about 124 nm, and a portion of the sacrificial layer, which is not carbonized, has a thickness of 1.25 μm.

In the embodiment of the present disclosure, in a case where the sacrificial layer is made of the photoresist, after being subjected to the ion implantation and modification, the photoresist is carbonized, and the carbonized photoresist has a molecular structure similar to that of diamond/graphite, which is stable, so that pollution to the chamber caused by volatilization of the sacrificial layer in subsequent processes can be reduced.

In some implementations, the step S206 further includes: before removing the sacrificial layer, modifying the sacrificial layer to facilitate removal of the sacrificial layer.

The sacrificial layer is modified through an ashing process by using oxygen plasma ($O_2$ plasma) to facilitate the subsequent removal of the sacrificial layer, and the process of modification does not damage the nanowire.

In some implementations, the step S206 further includes: before removing the sacrificial layer, removing impurities in the inducing particle by using an etching solution, and removing redundant amorphous silicon through an etching process.

The impurities include the implanted boron ions and phosphorus ions. In some implementations, the impurities in the inducing particle are removed by using the etching solution, for example, the impurities such as boron ions and/or phosphorus ions are removed from an indium sphere by using an etching solution for indium tin oxide.

In some implementations, the redundant sacrificial layer subjected to the modifying is removed by using a plasma etching process. For example, the amorphous silicon is removed through an etching process using hydrogen plasma.

In the embodiment of the present disclosure, before removing the sacrificial layer, the impurities in the inducing particle and the redundant amorphous silicon are removed by an etching process, and then the sacrificial layer is modified, which is helpful to improve the yield of the nanowire.

According to the method for manufacturing the nanowire provided in the embodiment of the present disclosure, the guide trench is formed in the sacrificial layer, the inducing particle is prepared in the guide trench, the precipitation layer is prepared on the surface of the sacrificial layer away from the substrate and in the guide trench, the precipitation layer covers the inducing particle, the precipitation layer is processed, the preset element in the precipitation layer is precipitated along the guide trench under the induction of the inducing particle to form the nanowire, and finally the sacrificial layer is removed, during removing the guide trench, the nanowire disorderly grown on the surface of the sacrificial layer can also be removed, so that only the nanowire is remained on the surface of the insulating layer, and the yield of the nanowire is improved, furthermore, it is also helpful to improve the overlapping between the nanowire and the electrode, reduce the contact barrier of metal-semiconductor contact, enhance the tunneling effect at the interface, and improve the mobility of the silicon nanowire.

Figures 4, 5:
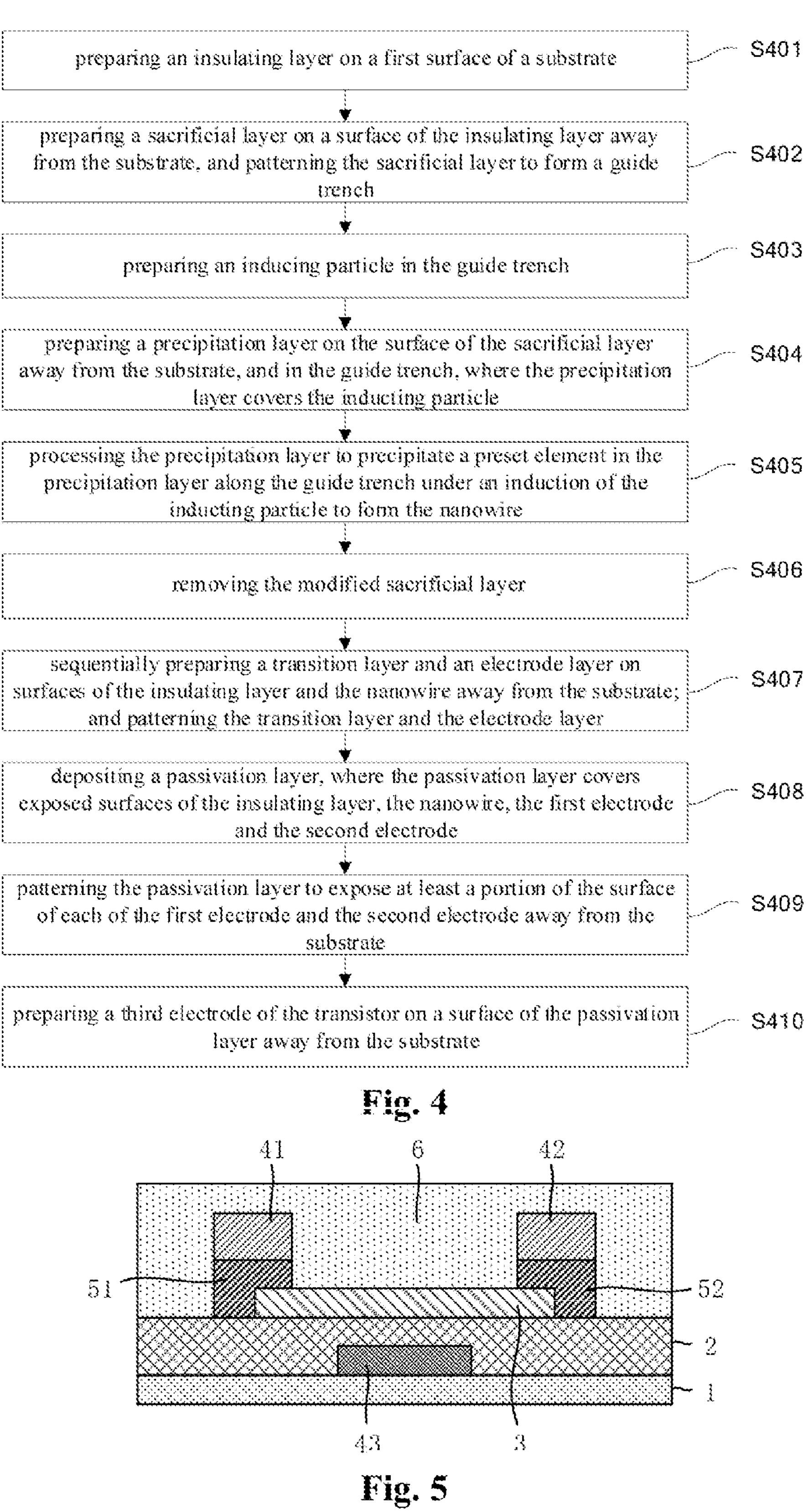
FIG. 4 is a flowchart of a method for manufacturing a thin film transistor according to an embodiment of the present disclosure.
FIG. 5 is a schematic structural diagram of a thin film transistor according to an embodiment of the present disclosure.

An embodiment of the present disclosure further provides a method for manufacturing a thin film transistor, and FIG. 4 is a flowchart of the method for manufacturing the thin film transistor provided by the embodiment of the present disclosure.

As shown in FIG. 4, the method for manufacturing the thin film transistor includes steps S401 to S410.

At step S401, preparing an insulating layer on a first surface of a substrate.

The substrate includes, but is not limited to, a glass substrate and a silicon substrate, and a material of the substrate is not limited in the present disclosure.

In an embodiment of the present disclosure, the substrate includes a first surface and a second surface disposed opposite to each other, the first surface is configured to carry various components of electronic devices. In some implementations, the second surface may also be configured to carry electronic devices. For convenience of description, the embodiment of the present disclosure is described by taking the first surface carrying the electronic devices as an example.

The insulating layer may be made of a material comprising silicon such as silicon nitride and silicon oxide, or an organic material such as polyimide and acrylic. A thickness of the insulating layer may be set in advance as desired, for example, the thickness of the insulating layer is about 4000 angstroms.

At step S402, preparing a sacrificial layer on a surface of the insulating layer away from the substrate, and patterning the sacrificial layer to form a guide trench.

The sacrificial layer may be formed by a coating process or other suitable processes. In some implementations, a material of the sacrificial layer includes one of a positive photoresist or a negative photoresist. The photoresist has low cost and can be prepared in a simple process, thus can reduce the manufacturing cost of the sacrificial layer.

For example, the positive photoresist serving as the sacrificial layer is prepared on the surface of the insulating layer away from the substrate by a coating process, and then the sacrificial layer is patterned by processes of exposure, development and etching to form the guide trench.

It should be noted that, during etching the sacrificial layer, only the sacrificial layer is etched, the insulating layer is not to be etched, so that a bottom of the guide trench is made of the insulating layer without the sacrificial layer. Portions, except the guide trench, of the surface of the insulating layer away from the substrate are covered by the sacrificial layer.

A thickness of the sacrificial layer is not limited in the embodiment of the present disclosure, and for example, the thickness of the sacrificial layer may be about 1.5 micrometers.

At step S403, preparing an inducing particle in the guide trench.

In some implementations, the inducing particle includes an indium particle or another suitable elemental particle. The inducing particle is helpful to the precipitation of the material for the nanowire so as to improve the generation efficiency of the nanowire.

In some implementations, the step S403 further includes: before preparing the inducing particles in the guide trench, depositing a catalytic layer on a surface of the sacrificial layer away from the substrate and in the guide trench, and patterning the catalytic layer, and then performing a reduction process on the patterned catalyst layer by using a plasma enhanced chemical vapor deposition process to obtain the inducing particle.

After the catalytic layer is patterned, a strip-shaped catalytic layer is obtained, and a length of the strip-shaped catalytic layer spans a width of the guide trench so as to form the inducing particle in the guide trench.

In some implementations, the catalytic layer is deposited by a physical vapor deposition process, a material of the catalytic layer includes indium tin oxide, and a thickness of the catalytic layer is not limited in the embodiment of the present disclosure, for example, the thickness of the catalytic layer may range from 100 angstroms to 500 angstroms.

The catalyst layer may be patterned through processes of coating, exposure, development and etching to obtain the strip-shaped catalyst layer. The width and length of the stripe-shaped catalytic layer are not limited in the embodiment of the present disclosure.

In the embodiment of the present disclosure, an indium-inducing particle is obtained by reducing indium tin oxide by the plasma enhanced chemical vapor deposition process using hydrogen plasma (H plasma).

At step S404, preparing a precipitation layer on the surface of the sacrificial layer away from the substrate and in the guide trench, the precipitation layer covering the inducing particle.

The precipitation layer is used for forming the nanowire, and a material of the precipitation layer includes a material of the nanowire. For example, the material of the precipitation layer includes amorphous silicon (a-Si). A thickness of the precipitation layer is not limited in the embodiment of the present disclosure, and for example, the thickness of the precipitation layer is about 300 angstroms.

At step S405, processing the precipitation layer to precipitate a preset element in the precipitation layer along the guide trench under an induction of the inducing particle to form the nanowire.

In some implementations, the nanowire is generated by precipitating a silicon element of the amorphous silicon layer along the guide trench under the induction of the inducing particle through annealing.

In some implementations, the annealing may be performed under a temperature in a range from 350° C. to 400° C., and the annealing may be performed for a time duration in a range from 30 min to 60 min.

In some implementations, the step S405 of processing the precipitation layer to precipitate the preset element in the precipitation layer along the guide trench under the induction of the inducing particle to form the nanowire includes:

annealing the precipitation layer to precipitate silicon in the precipitation layer along the guide trench under the induction of the inducing particle to obtain a silicon nanowire.

At step S406, removing the modified sacrificial layer.

In the step S406, the modified sacrificial layer is removed by a peeling-off process.

In some implementations, the step S403 further includes: before preparing the inducing particle in the guide trench, processing the sacrificial layer by an ion implantation to form a porous structure in a surface layer of the sacrificial layer away from the substrate, that is, carbonizing the sacrificial layer.

The surface of the sacrificial layer away from the substrate is processed by the ion implantation, the porous structure is formed in the surface layer of the sacrificial layer away from the substrate, the porous structure is similar to a molecular structure of diamond or graphite, thus has high stability, and pollution to a chamber caused by the sacrificial layer in subsequent processes can be avoided; moreover, a chemical solvent may be diffused to interior of the sacrificial layer through the surface layer of the porous structure to dissolve the interior of the sacrificial layer, so that the surface layer of the sacrificial layer falls off, facilitating removal of the sacrificial layer.

In some implementations, the porous structure is formed in the surface layer of the sacrificial layer away from the substrate by means of the ion implantation, and ions to be implanted include at least one of phosphorus ions ($P^+$) or boron ions ($B^+$). In some implementations, a thickness of the porous structure accounts for one thousandth to one hundredth of a total thickness of the sacrificial layer.

In some implementations, an acceleration voltage for the ion implantation ranges from 10 keV to 70 keV and an implantation dose for the ion implantation ranges from $1\times10^{13}$ ions/cm$^2$ to $5\times10^{14}$ ions/cm$^2$. Phosphorus ions and/or boron ions are implanted into the sacrificial layer under the acceleration voltage ranging from 10 keV to 70 keV, so that the phosphorus ions and/or the boron ions are positioned at a certain depth of the surface layer of the sacrificial layer, thus the sacrificial layer can be modified, the influence of the sacrificial layer on the subsequent processes is reduced, and subsequent removal of the sacrificial layer is also facilitated and the residue of the material of the sacrificial layer is reduced.

In the embodiment of the present disclosure, in a case where the sacrificial layer is made of the photoresist, after being subjected to the ion implantation and modification, the photoresist is carbonized, and the carbonized photoresist has a molecular structure similar to that of diamond/graphite, which is stable, so that pollution to the chamber caused by volatilization of the sacrificial layer in subsequent processes can be reduced.

In some implementations, the step S406 further includes: before removing the modified sacrificial layer, modifying the sacrificial layer.

For example, the sacrificial layer is modified through an ashing process by using oxygen plasma ($O_2$ plasma) to facilitate the subsequent removal of the sacrificial layer, and the process of modification does not damage the nanowire.

In some implementations, the step S406 further includes: before removing the modified sacrificial layer, removing impurities in the inducing particle by using an etching solution, and removing redundant amorphous silicon through an etching process.

The impurities include the implanted boron ions and phosphorus ions. In some implementations, the impurities in the inducing particle are removed by using the etching solution, for example, the impurities such as boron ions and/or phosphorus ions are removed from an indium sphere by using an etching solution for indium tin oxide.

In some implementations, the redundant sacrificial layer subjected to the modifying is removed by using a plasma etching process. For example, the amorphous silicon is removed through an etching process using hydrogen plasma.

In the embodiment of the present disclosure, before removing the sacrificial layer, the impurities in the inducing particle and the redundant amorphous silicon are removed by an etching process, and then the sacrificial layer is modified, which is helpful to improve the yield of the nanowire.

In some implementations, after the step S406 of removing the modified sacrificial layer, the method further includes a step S407:

sequentially preparing a transition layer and an electrode layer on surfaces of the insulating layer and the nanowire away from the substrate; and patterning the transition layer and the electrode layer to obtain a first electrode and a second electrode of a transistor in the electrode layer, and obtain a first transition electrode and a second transition electrode in the transition layer.

The transition layer is made of a material of $N^+$ amorphous silicon or other materials with good conductivity. A V-group element such as arsenic and phosphorus may be adopted for $N^+$ atoms. A thickness of the transition layer is not limited in the embodiment of the present disclosure, as long as the thickness of the transition layer can cover the nanowire, for example, the thickness of the transition layer may be about 500 angstroms. The electrode layer may be made of a conductive material of metal such as molybdenum, copper, and aluminum. A thickness of the electrode layer is not limited in the embodiment of the present disclosure, and for example, the thickness of the electrode layer is about 2200 angstroms.

In some implementations, during patterning the transition layer and the electrode layer, the transition layer and the electrode layer are patterned by using a single mask, so that the first transition electrode and the second transition electrode are obtained in the transition layer, and the first electrode and the second electrode are obtained in the electrode layer. The first electrode and the second electrode are two electrodes of the transistor, for example, the first electrode is a drain electrode, and the second electrode is a source electrode.

In the embodiment of the present disclosure, the single mask is adopted to pattern the transition layer and the electrode layer, so that the process for preparing the transistor can be simplified, and the cost of the transistor can be reduced.

In the embodiment of the present disclosure, the transition layer can improve the problem of overlapping fault between the electrode layer and the nanowire, reduce the contact barrier of metal-semiconductor contact, enhance the tunneling effect at the interface, reduce the maximum resistance of the transistor, and even avoid the problem of low on-state current of the thin film transistor caused by a large resistance of the transistor.

In some implementations, after the step S407 of patterning the transition layer and the electrode layer, the method further includes a step S408:

depositing a passivation layer covering exposed surfaces of the insulating layer, the nanowire, the first electrode and the second electrode.

A material of the passivation layer includes, but is not limited to, silicon oxide (SiOx) and silicon nitride (SiNx). A thickness of the passivation layer is not limited in the embodiment of the present disclosure, as long as the passivation layer can cover the electrode layer, for example, the thickness of the passivation layer may be about 800 angstroms or about 400 angstroms.

In some implementations, after the step S408 of depositing the passivation layer, the method further includes steps S409 and S410.

At step S409, patterning the passivation layer to expose at least a portion of the surface of each of the first electrode and the second electrode away from the substrate.

In some implementations, the passivation layer may be patterned by processes of coating, exposure, and development to expose at least a portion of the surface of each of the first electrode and the second electrode away from the substrate.

At step S410, preparing a third electrode of the transistor on a surface of the passivation layer away from the substrate.

A material of the third electrode may be a conductive metal, such as molybdenum or copper. A thickness of the third electrode is not limited in the embodiment of the present disclosure, and for example, the thickness of the third electrode is about 500 angstroms or about 2200 angstroms.

In some implementations, the third electrode may serve as a gate electrode of the thin film transistor, and the first electrode, the second electrode, and the third electrode constitute the transistor. Since the gate electrode is on top of the passivation layer, the thin film transistor may be referred to as a transistor of a top gate structure.

In some implementations, the thin film transistor may also adopt a bottom gate structure, and for the thin film transistor with the bottom gate structure, before the step S401 of preparing the insulating layer on the first surface of the substrate, the method further includes: preparing the third electrode of the transistor on the first surface of the substrate.

The third electrode serves as the gate electrode of the transistor, a material of the third electrode may be molybdenum, copper or another conductive metal, and a thickness of the third electrode may be about 500 angstroms or about 2200 angstroms. The thickness of the third electrode is not limited in the embodiment of the present disclosure.

According to the method for manufacturing the transistor provided in the embodiment of the present disclosure, the guide trench is formed in the sacrificial layer, the inducing particle is prepared in the guide trench, the precipitation layer is prepared on the surface of the sacrificial layer away from the substrate and in the guide trench, the precipitation layer covers the inducing particle, the precipitation layer is processed, the preset element in the precipitation layer is precipitated along the guide trench under the induction of the inducing particles to form the nanowire, and finally the sacrificial layer is removed, during removing the guide trench, the nanowire disorderly grown on the surface of the sacrificial layer can also be removed, so that only the nanowire is remained on the surface of the insulating layer, and the yield of the nanowire is improved, furthermore, it is also helpful to improve the overlapping between the nanowire and the electrode, reduce the contact barrier of metal-semiconductor contact, enhance the tunneling effect at the interface, and improve the mobility of the silicon nanowire.

An embodiment of the present disclosure further provides a thin film transistor, which improves the performance of overlapping of the electrode and the nanowire and improves the mobility of the nanowire.

FIG. 5 is a schematic structural diagram of the thin film transistor according to the embodiment of the present disclosure. As shown in FIG. 5, the thin film transistor includes: a substrate 1, an insulating layer 2, a nanowire 3, and an electrode layer.

The substrate includes a first surface. The substrate includes, but is not limited to, a glass substrate and a silicon substrate, and a material of the substrate is not limited in the present disclosure. The substrate includes the first surface and a second surface that are oppositely disposed, and the first surface and the second surface may be configured to carry various components of electronic devices.

The insulating layer 2 is arranged on the first surface of the substrate 1. A material of the insulating layer 2 may be a material comprising silicon such as silicon nitride and silicon oxide, or organic material such as polyimide and acrylic. A thickness of the insulating layer is not limited in the embodiment of the present disclosure.

The nanowire 3 is arranged on a surface of the insulating layer 2 away from the substrate 1.

A material of the nanowire 3 may be silicon, but other materials may also be adopted. After the nanowire 3 is prepared, the sacrificial layer for preparing the nanowire and the nanowire disorderly grown on the surface of the sacrificial layer away from the substrate 1 are removed, so that only the nanowire is remained on the surface of the insulating layer 2 away from the substrate 1.

The electrode layer is superposed on the surface of the insulating layer 2 away from the substrate 1, and a first electrode 41 arranged in the electrode layer is electrically connected with a source region of the nanowire 3, and a second electrode 42 arranged in the electrode layer is electrically connected with a drain region of the nanowire.

In some implementations, the material of the electrode layer may be a conductive material of metal, for example, the material of the electrode layer 4 includes at least one of molybdenum, copper, or aluminum. The first electrode 41 and the second electrode 42 may serve as a source and a drain of the thin film transistor, respectively. In some implementations, a first transition electrode 51 is disposed between the first electrode 41 and the source region of the nanowire 3, and a second transition electrode 52 is disposed between the second electrode 42 and the drain region of the nanowire 3. The first transition electrode 51 can improve the problem of overlapping fault of the first electrode 41 and the nanowire 3, reduce the contact barrier of metal-semiconductor contact, enhance the tunneling effect at the interface, and reduce the large resistance of the transistor.

In the thin film transistor provided by the embodiment of the present disclosure, the electrode layer 4 is superposed on the surface of the insulating layer 2 away from the substrate 1, that is, there is no the sacrificial layer and the nanowire disorderly grown, for preparing the nanowire 3, between the electrode layer 4 and the insulating layer 2, so that the influence of the step difference caused by the guide trench can be eliminated, the overlapping of the electrode layer 4 and the nanowire 3 is improved, and the mobility of the nanowire is improved. Furthermore, there is no nanowire disorderly grown between the electrode layer 4 and the insulating layer 2, the yield of the nanowire can be improved.

In some implementations, the insulating layer includes a first portion having an orthographic projection on the substrate coincident with an orthographic projection of the nanowire on the substrate, the first portion is doped with at least one of phosphorous ions or boron ions. The phosphorus ions and the boron ions are ions implanted during the sacrificial layer being subjected to a carbonization treatment.

In some implementations, a maximum depth that the ions are doped in the insulating layer ranges from 1000 angstroms to 3000 angstroms.

In the process of implanting ions into the sacrificial layer, the ions can penetrate through the guide trench to reach a bottom of the guide trench, and since the bottom of the guide trench is the insulating layer, the ions are implanted into the first portion of the insulating layer and into the sacrificial layer.

In some implementations, a material of the first transition electrode 51 and the second transition electrode 52 is $N^+$ type amorphous silicon ($N^+$ a-Si).

In some implementations, the thin film transistor further includes a passivation layer 6, and the passivation layer 6 covers exposed surfaces of the insulating layer 2, the electrode layer and the nanowire 3. The passivation layer 6 can protect the insulating layer 2, the electrode layer and the nanowire 3, so that the service life of the thin film transistor is prolonged.

In some implementations, the thin film transistor further includes a third electrode 43, and the third electrode 43 is disposed between the substrate 1 and the insulating layer 2.

The third electrode 43 may serve as a gate electrode of the thin film transistor, and the first electrode 41, the second electrode 42, and the third electrode 43 constitute the thin film transistor. Since the third electrode 43 is disposed at the bottom of the thin film transistor, i.e., the gate electrode is disposed at the bottom of the thin film transistor, the thin film transistor may be referred to as a transistor of a bottom gate structure.

Figure 6:
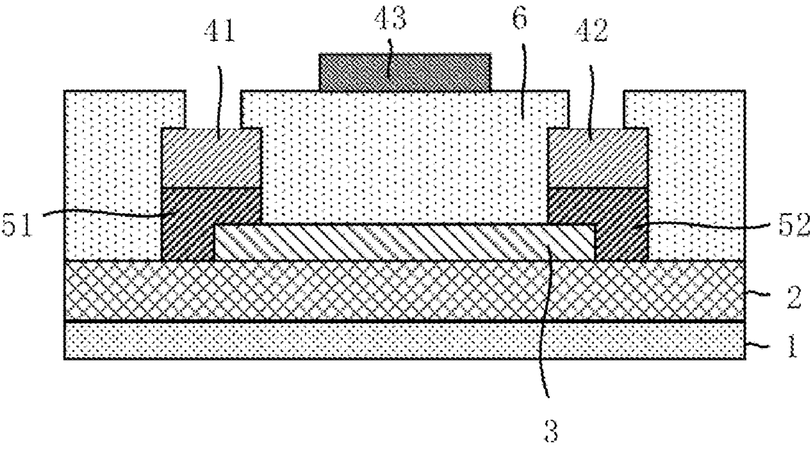
FIG. 6 is a schematic structural diagram of a thin film transistor according to an embodiment of the present disclosure.

In some implementations, as shown in FIG. 6, the thin film transistor further includes a passivation layer 6 and a third electrode 43, and the passivation layer 6 covers exposed surfaces of the insulating layer 2 and the nanowire 3. The third electrode 43 is arranged on a surface of the passivation layer 6 away from the substrate 1. Since the third electrode 43 is disposed on top of the thin film transistor, i.e., the gate electrode is on top of the passivation layer, the thin film transistor may be referred to as a transistor of a top gate structure.

In the thin film transistor provided by the embodiment of the present disclosure, the electrode layer 4 is superposed on the surface of the insulating layer 2 away from the substrate 1, that is, there is no the sacrificial layer and the nanowire disorderly grown, for preparing the nanowire 3, between the electrode layer 4 and the insulating layer 2, so that the influence of the step difference caused by the guide trench can be eliminated, the overlapping of the electrode layer 4 and the nanowire 3 is improved, the contact barrier of electrode layer-nanowire contact is reduced, the tunneling effect at the interface is enhanced, and the mobility of the nanowire is improved. Furthermore, there is no nanowire disorderly grown between the electrode layer 4 and the insulating layer 2, the yield of the nanowire can be improved.

For better understanding of the thin film transistor and the method for manufacturing the thin film transistor in the present disclosure, the following description is made with reference to FIG. 7 to FIG. 24 by taking the thin film transistor of the bottom gate structure as an example. The cross-sectional views in FIG. 7 to FIG. 24 are cross-sectional views taken along a line A-A in the perspective views corresponding thereto.

Figure 7:
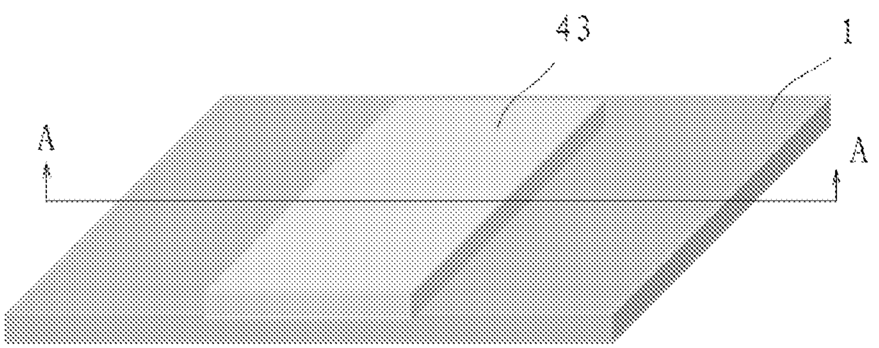
FIG. 7 is a schematic perspective view of a structure of a thin film transistor subjected to a step S701 in an embodiment of the present disclosure.
Figure 8:
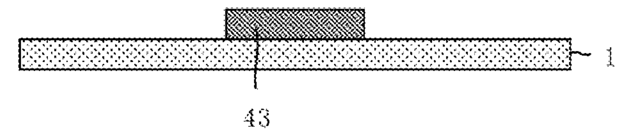
FIG. 8 is a schematic cross-sectional diagram of the thin film transistor subjected to the step S701 in the embodiment of the present disclosure.

At step S701, preparing a metal layer, such as a molybdenum layer, on a first surface of a substrate 1 (a thickness of the molybdenum layer may be about 500 angstroms), and then patterning the metal layer to obtain a third electrode 43, i.e., a gate electrode, as shown in FIGS. 7 and 8.

Figure 9:
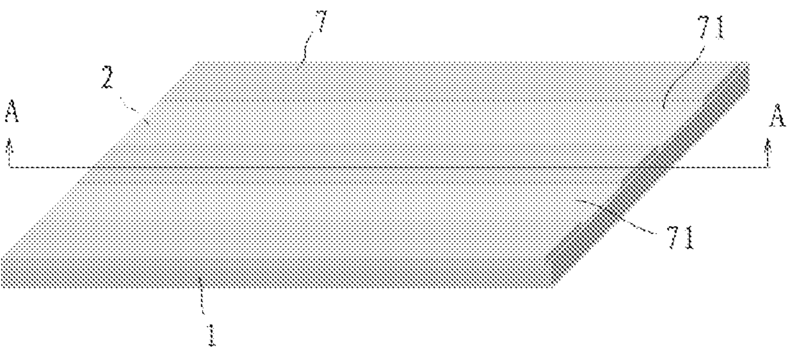
FIG. 9 is a schematic perspective view of a structure of a thin film transistor subjected to a step S702 in the embodiment of the present disclosure.
Figures 10, 11, 12, 13:
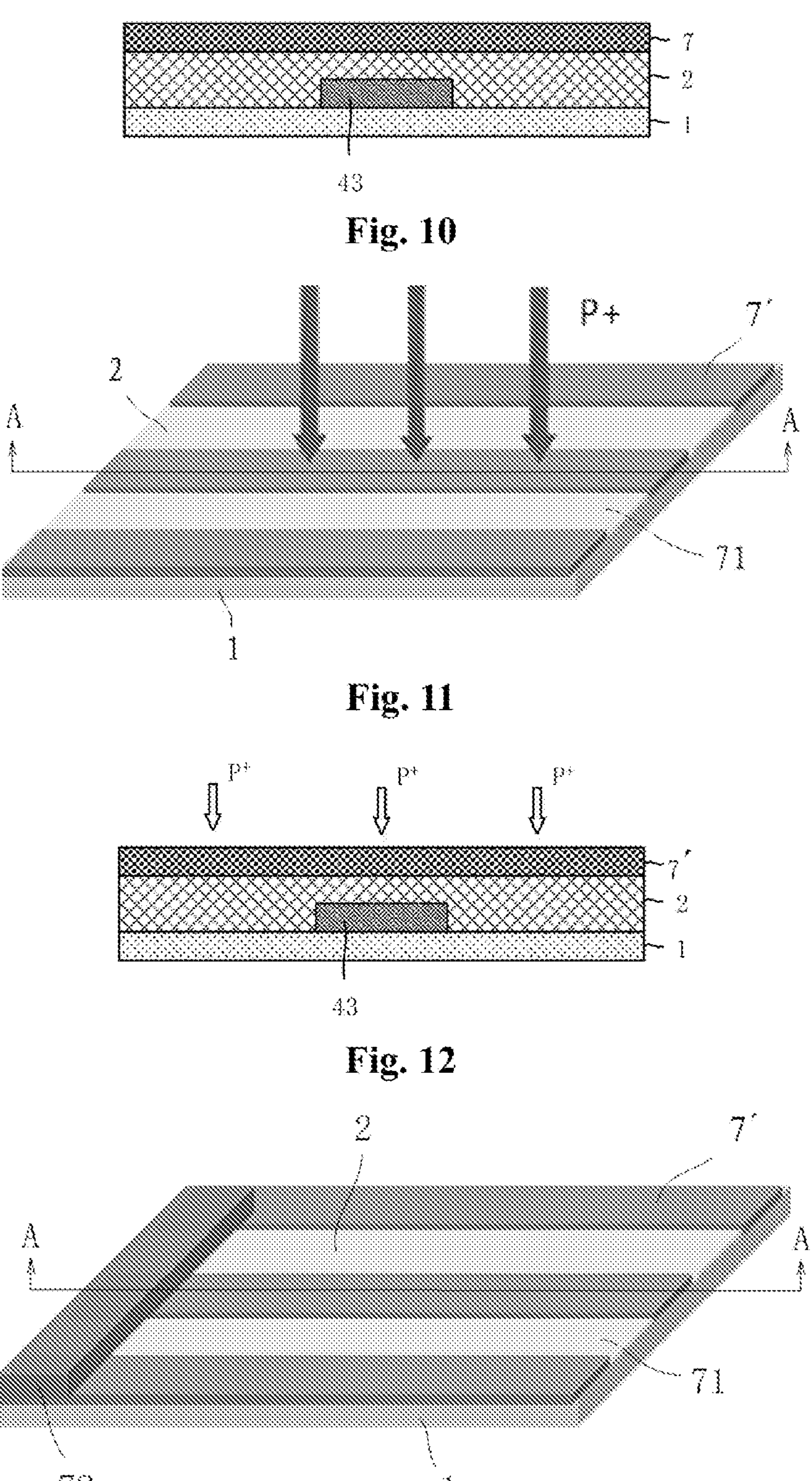
FIG. 10 is a schematic cross-sectional diagram of the thin film transistor subjected to the step S702 in the embodiment of the present disclosure.
FIG. 11 is a schematic perspective view of a structure of a thin film transistor subjected to a step S703 in the embodiment of the present disclosure.
FIG. 12 is a schematic cross-sectional diagram of the thin film transistor subjected to the step S703 in the embodiment of the present disclosure.
FIG. 13 is a schematic perspective view of a structure of a thin film transistor subjected to a step S704 in the embodiment of the present disclosure.

At step S702, depositing an insulating layer 2 to cover exposed surfaces of the third electrode 43 and the substrate 1; then, coating a sacrificial layer 7 on a surface of the insulating layer 2, and then exposing and developing the sacrificial layer 7 to obtain a patterned sacrificial layer, thereby forming a guide trench 71, as shown in FIGS. 9 and 10.

In the step S702, the insulating layer 2 may be made of a material of $SiO_x$, a thickness of the insulating layer 2 may be about 4000 angstroms, and the sacrificial layer is made of photoresist. It should be noted that, during patterning the sacrificial layer, the insulating layer 2 is not etched.

In a case where a plurality of guide trenches 71 are provided in the sacrifice layer 7, the plurality of guide trenches 71 are provided at intervals.

At step S703, performing an ion implantation on the sacrificial layer, so as to carbonize the sacrificial layer, and obtain a carbonized sacrificial layer 7' (which may reduce the pollution to the chamber caused by the sacrificial layer in subsequent processes), as shown in FIGS. 11 and 12.

In the step S703, phosphorus ions with a dose of about $5\times10^{14}$ ions/cm$^2$ are implanted into the sacrificial layer under an acceleration voltage of about 70 kev.

Figure 14:
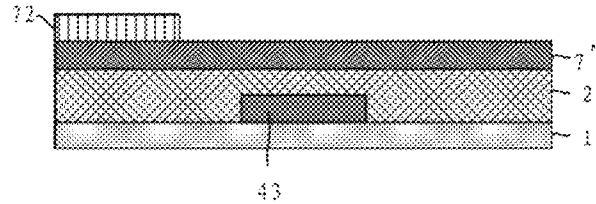
FIG. 14 is a schematic cross-sectional diagram of the thin film transistor subjected to the step S704 in the embodiment of the present disclosure.

At step S704, preparing a catalytic layer 72 on a surface of the sacrificial layer 7 away from the substrate 1 and in the guide trench 71, and patterning the catalytic layer 72, as shown in FIGS. 13 and 14.

In the step S704, indium tin oxide is deposited, by a deposition process, on the surface of the sacrificial layer 7 away from the substrate 1 and in the guide trench 71 to obtain a catalytic layer, and then the catalytic layer 72 is patterned by processes of coating, exposure, development and etching. The patterned catalytic layer may have a strip-shaped structure, and a length of the strip-shaped catalytic layer is enough to cover the guide trenches 71 arranged at intervals to ensure that each guide trench 71 is to be formed with an inducing particle therein.

Figure 15:
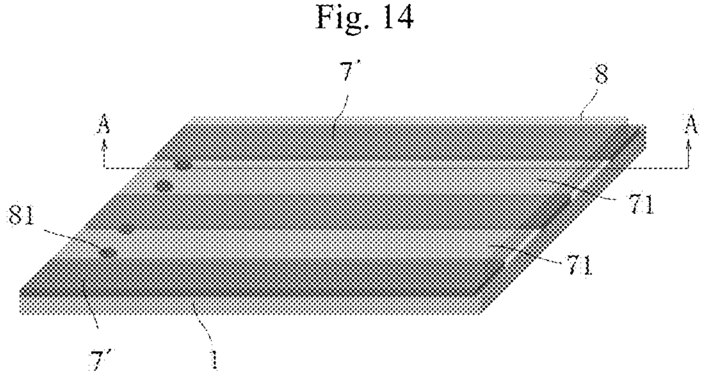
FIG. 15 is a schematic perspective diagram of a structure of a thin film transistor subjected to a step S705 in the embodiment of the present disclosure.
Figure 16:
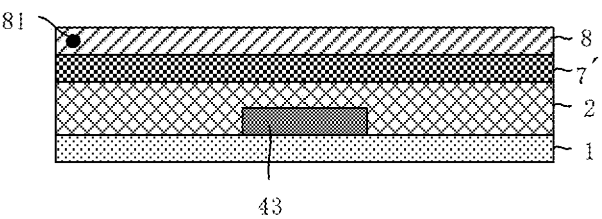
FIG. 16 is a schematic cross-sectional diagram of the thin film transistor subjected to the step S705 in the embodiment of the present disclosure.

At step S705, reducing the patterned catalytic layer by using a plasma enhanced chemical vapor deposition process to obtain inducing particles 81, and then depositing a precipitation layer 8 covering the inducing particles, as shown in FIGS. 15 and 16.

In the step S705, a material of the catalytic layer includes indium tin oxide, the catalytic layer is reduced through a plasma enhanced chemical vapor deposition process by using hydrogen plasma to obtain indium-inducing particles, and then an a-Si layer is deposited as the precipitation layer. Since the sacrificial layer has been subjected to the carbonization treatment in the step S703 so that the sacrificial layer is formed into a molecule structure similar to that of diamond/graphite, the chamber can not be contaminated by the sacrificial layer during the catalytic layer being subjected to the process of reducing.

Figure 17:
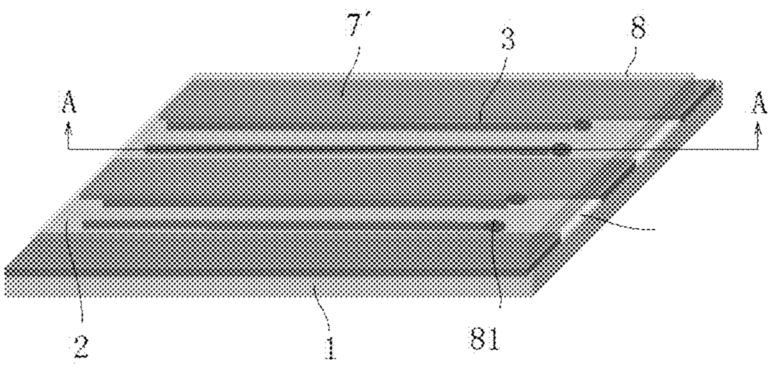
FIG. 17 is a schematic perspective diagram of a structure of a thin film transistor subjected to a step S706 in the embodiment of the present disclosure.
Figure 18:
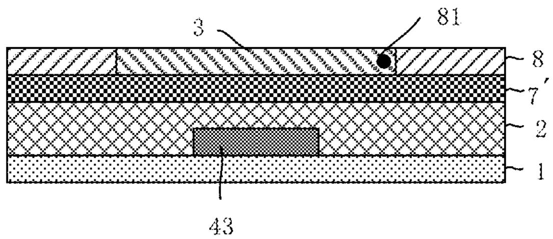
FIG. 18 is a schematic cross-sectional diagram of the thin film transistor subjected to the step S706 in the embodiment of the present disclosure.

At step S706, performing an annealing treatment on the precipitation layer to precipitate silicon in the precipitation layer along the guide trench under an induction of the inducing particles, so as to obtain a silicon nanowire, as shown in FIGS. 17 and 18.

In the embodiment of the present disclosure, the annealing may be performed under a temperature ranging from 350° C. to 400° C., and the annealing may be performed for a time duration ranging from 30 min to 60 min.

Figure 19:
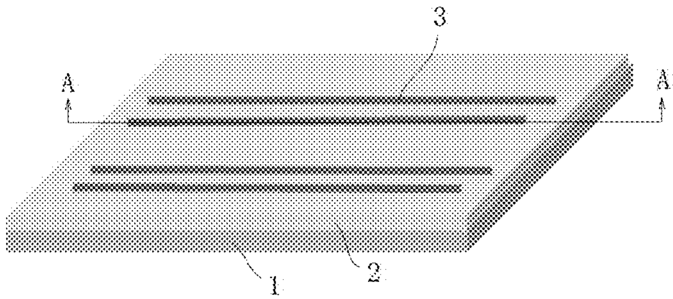
FIG. 19 is a schematic perspective diagram of a structure of a thin film transistor subjected to a step S707 in the embodiment of the present disclosure.
Figure 20:
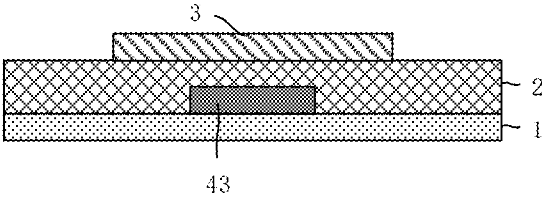
FIG. 20 is a schematic cross-sectional diagram of the thin film transistor subjected to the step S707 in the embodiment of the present disclosure.

At step S707, removing impurities such as phosphorus and/or boron in the indium-inducing particles by using an etching solution for indium-tin oxide; removing the precipitation layer 8 by an etching process, i.e., removing redundant a-Si by a plasma enhanced chemical vapor deposition process using hydrogen plasma, and then modifying the carbonized sacrificial layer by an ashing process using oxygen plasma, and then removing the sacrificial layer, as shown in FIGS. 19 and 20.

Figure 21:
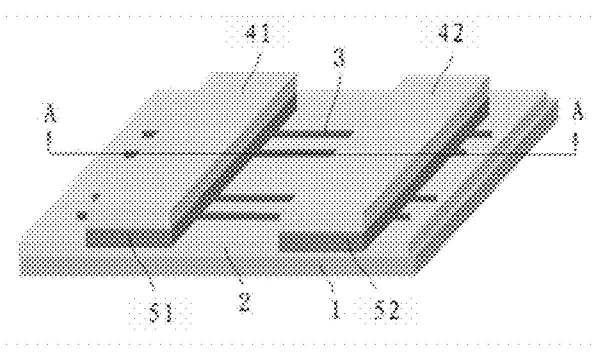
FIG. 21 is a schematic perspective diagram of a structure of a thin film transistor subjected to a step S708 in the embodiment of the present disclosure.

At step 708, sequentially preparing a transition layer and an electrode layer on surfaces of the insulating layer 2 and the nanowire 3 away from the substrate 1; patterning the transition layer and the electrode layer, so that a first electrode 41 and a second electrode 42 of the transistor are obtained in the electrode layer, and a first transition electrode 51 and a second transition electrode 52 are obtained in the transition layer, as shown in FIGS. 21 and 22.

In the step S708, $N^+$ type amorphous silicon ($N^+$ a-Si) is sequentially prepared on the surfaces of the insulating layer 2 and the nanowire 3 away from the substrate 1 to obtain a transition layer, molybdenum is then deposited to obtain the electrode layer, the transition layer and the electrode layer are etched by using a mask obtained by coating, exposure and development, so that the first transition electrode 51 and the second transition electrode 52 are obtained in the transition layer, and the first electrode 41 and the second electrode 42 are obtained in the electrode layer.

At step S709, depositing a passivation layer covering the exposed surfaces of the insulating layer, the nanowire, the first electrode and the second electrode, as shown in FIGS. 21 and 22.

In the step S709, silicon oxide is deposited by a physical vapor deposition process as the passivation layer 6, and the passivation layer 6 covers the exposed surfaces of the insulating layer 2, the nanowire 3, the first electrode 41, the second electrode 42, the first transition electrode 51, and the second transition electrode 52, as shown in FIGS. 23 and 24.

An embodiment of the present disclosure further provides a semiconductor device, which includes the thin film transistor provided in the embodiment of the present disclosure, since the sacrificial layer is removed, the influence of the step difference of the guide trench can be eliminated, the overlapping of the nanowire and the electrode is improved, the contact barrier of metal-semiconductor contact is reduced, the tunneling effect at the interface is enhanced, the mobility of the silicon nanowire is improved, and thus the overall performance of the semiconductor device can be improved.

It will be understood that the above embodiments are merely exemplary embodiments employed to illustrate the principles of the present disclosure, and the present disclosure is not limited thereto. It will be apparent to those skilled in the art that various improvements and modifications can be made without departing from the spirit and scope of the present disclosure, and these improvements and modifications are to be considered within the scope of the present disclosure.

What is claimed is:

1. A method for manufacturing a nanowire, comprising:
- preparing an insulating layer on a first surface of a substrate;
- preparing a sacrificial layer on a surface of the insulating layer away from the substrate, and patterning the sacrificial layer to form a guide trench;
- preparing an inducing particle in the guide trench;
- preparing a precipitation layer on a surface of the sacrificial layer away from the substrate and in the guide trench, the precipitation layer covering the inducing particle;
- processing the precipitation layer to precipitate a preset element in the precipitation layer along the guide trench under an induction of the inducing particle to form a nanowire; and
- removing the sacrificial layer, wherein
- the inducing particle comprises an indium particle, and the preparing an inducing particle in the guide trench comprises:
  - depositing a catalytic layer on the surface of the sacrificial layer away from the substrate and in the guide trench, and patterning the catalytic layer; and
  - reducing the patterned catalytic layer by using a plasma enhanced chemical vapor deposition process to form the inducing particle.

2. The method of claim 1, wherein the catalytic layer is made of a material of indium tin oxide, and the precipitation layer is made of a material of amorphous silicon;
- the processing the precipitation layer to precipitate a preset element in the precipitation layer along the guide trench under an induction of the inducing particle to form a nanowire comprises:
  - annealing the precipitation layer to precipitate silicon in the precipitation layer along the guide trench under the induction of the inducing particle to form a silicon nanowire.

3. The method of claim 1, further comprising:
- before removing the sacrificial layer, removing impurities in the inducing particle by using an etching solution; and
- removing the precipitation layer by using an etching process.

4. A method for manufacturing a thin film transistor comprising an active layer, comprising: the method of claim 1,
- wherein the active layer comprises a nanowire.

5. The method of claim 4, further comprising:
- after removing the sacrificial layer, sequentially preparing a transition layer and an electrode layer on surfaces of the insulating layer and the nanowire away from the substrate, a material of the transition layer comprising $N^+$ type amorphous silicon; and
- patterning the transition layer and the electrode layer so as to obtain a first electrode and a second electrode of the transistor in the electrode layer, and obtain a first transition electrode and a second transition electrode in the transition layer.

6. The method of claim 5, wherein the transition layer and the electrode layer are patterned by using a single mask to obtain the first transition electrode and the second transition electrode in the transition layer, and obtain the first electrode and the second electrode in the electrode layer, the first transition electrode and the first electrode are stacked, and the second transition electrode and the second electrode are stacked.

7. The method of claim 5, further comprising:

after patterning the transition layer and the electrode layer, depositing a passivation layer covering exposed surfaces of the insulating layer, the nanowire, the first electrode and the second electrode.

8. The method of claim 7, further comprising:

after depositing a passivation layer, patterning the passivation layer to expose at least a portion of a surface of each of the first electrode and the second electrode away from the substrate; and preparing a third electrode of the transistor on a surface of the passivation layer away from the substrate.

9. The method of claim 4, further comprising:

before preparing the insulating layer on the first surface of the substrate, preparing a third electrode of the transistor on the first surface of the substrate.

10. A method for manufacturing a nanowire, comprising:

preparing an insulating layer on a first surface of a substrate;

preparing a sacrificial layer on a surface of the insulating layer away from the substrate, and patterning the sacrificial layer to form a guide trench;

preparing an inducing particle in the guide trench;

preparing a precipitation layer on a surface of the sacrificial layer away from the substrate and in the guide trench, the precipitation layer covering the inducing particle;

processing the precipitation layer to precipitate a preset element in the precipitation layer along the guide trench under an induction of the inducing particle to form a nanowire; and removing the sacrificial layer, wherein the method further comprising:

before preparing the inducing particle in the guide trench, processing the sacrificial layer through an ion implantation so as to form a porous structure in a surface layer of the sacrificial layer away from the substrate, wherein a material of the sacrificial layer comprises one of a positive photoresist or a negative photoresist.

11. A thin film transistor, comprising:

a substrate comprising a first surface;

an insulating layer arranged on the first surface of the substrate;

a nanowire arranged on a surface of the insulating layer away from the substrate;

an electrode layer superposed on the surface of the insulating layer away from the substrate, wherein a first electrode arranged in the electrode layer is electrically connected with a source region of the nanowire, and a second electrode arranged in the electrode layer is electrically connected with a drain region of the nanowire wherein the insulating layer comprises a first portion having an orthographic projection on the substrate coincident with an orthographic projection of the nanowire on the substrate, the first portion is doped with at least one of phosphorus ions or boron ions.

12. The thin film transistor of claim 11, wherein a maximum depth that the ions are doped in the insulating layer ranges from 1000 angstroms to 3000 angstroms.

13. The thin film transistor of claim 11, wherein a first transition electrode is disposed between the first electrode and the source region of the nanowire, and a second transition electrode is disposed between the second electrode and the drain region of the nanowire.

14. The thin film transistor of claim 13, wherein the first transition electrode and the second transition electrode are made of a material of $N^+$ type amorphous silicon.

15. The thin film transistor of claim 11, further comprising: a third electrode disposed between the substrate and the insulating layer.

16. The thin film transistor of claim 15, further comprising: a passivation layer covering exposed surfaces of the insulating layer, the electrode layer, and the nanowire.

17. The thin film transistor of claim 11, further comprising: a passivation layer and a third electrode, wherein the passivation layer covers exposed surfaces of the insulating layer and the nanowire;

the third electrode is arranged on a surface of the passivation layer away from the substrate.

18. A semiconductor device, comprising: the thin film transistor of claim 11.

* * * * *